(12) United States Patent
Balakrishnan et al.

(10) Patent No.: US 9,735,258 B2
(45) Date of Patent: Aug. 15, 2017

(54) NANOWIRE SEMICONDUCTOR DEVICE

(71) Applicant: International Business Machines Corporation, Armonk, NY (US)

(72) Inventors: Karthik Balakrishnan, White Plains, NY (US); Pouya Hashemi, White Plains, NY (US); Sanghoon Lee, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/293,572

(22) Filed: Oct. 14, 2016

(65) Prior Publication Data

US 2017/0179251 A1    Jun. 22, 2017

Related U.S. Application Data

(62) Division of application No. 14/978,362, filed on Dec. 22, 2015, now Pat. No. 9,613,873.

(51) Int. Cl.
| | |
|---|---|
| *H01L 21/20* | (2006.01) |
| *H01L 29/66* | (2006.01) |
| *H01L 29/06* | (2006.01) |
| *H01L 29/78* | (2006.01) |
| *H01L 21/02* | (2006.01) |
| *H01L 29/20* | (2006.01) |

(52) U.S. Cl.
CPC .... *H01L 29/6681* (2013.01); *H01L 21/02428* (2013.01); *H01L 21/02433* (2013.01); *H01L 21/02538* (2013.01); *H01L 21/02639* (2013.01); *H01L 29/0673* (2013.01); *H01L 29/6653* (2013.01); *H01L 29/66522* (2013.01); *H01L 29/66553* (2013.01); *H01L 29/7853* (2013.01); *H01L 29/20* (2013.01)

(58) Field of Classification Search
CPC ........... H01L 29/6681; H01L 29/66522; H01L 29/66553; H01L 29/6653
USPC ........................................................ 438/478
See application file for complete search history.

(56) References Cited

PUBLICATIONS

List of IBM Patents or Patent Applications Treated as Related (Appendix P); Filed Oct. 14, 2016, 2 pages.
Karthik Balakrishnan, et al., "Nanowire Semiconductor Device," U.S. Appl. No. 14/978,362, filed Dec. 22, 2015.

*Primary Examiner* — Anthony Ho
(74) *Attorney, Agent, or Firm* — Cantor Colburn LLP; Luis Percello

(57) ABSTRACT

A method for forming a nanowire device comprises depositing a hard mask on portions of a silicon substrate having a <110> orientation wherein the hard mask is oriented in the <112> direction, etching the silicon substrate to form a mandrel having (111) faceted sidewalls; forming a layer of insulator material on the substrate; forming a sacrificial stack comprising alternating layers of sacrificial material and dielectric material disposed on the layer of insulator material and adjacent to the mandrel; patterning and etching the sacrificial stack to form a modified sacrificial stack adjacent to the mandrel and extending from the mandrel; removing the sacrificial material from the modified sacrificial stack to form growth channels; epitaxially forming semiconductor in the growth channels; and etching the semiconductor to align with the end of the growth channels and form a semiconductor stack comprising alternating layers of dielectric material and semiconductor material.

16 Claims, 14 Drawing Sheets

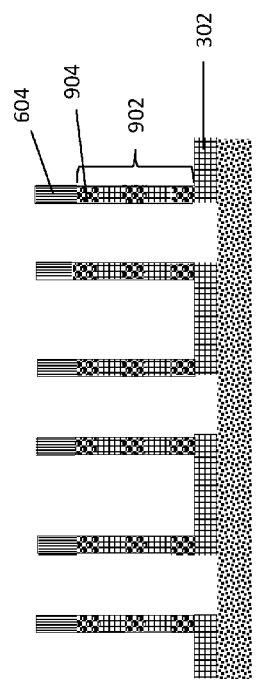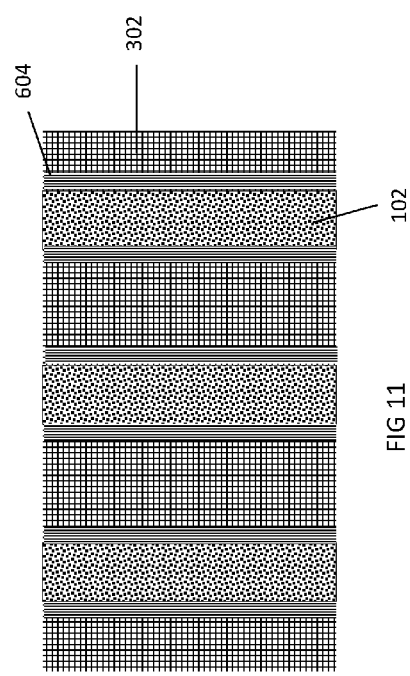

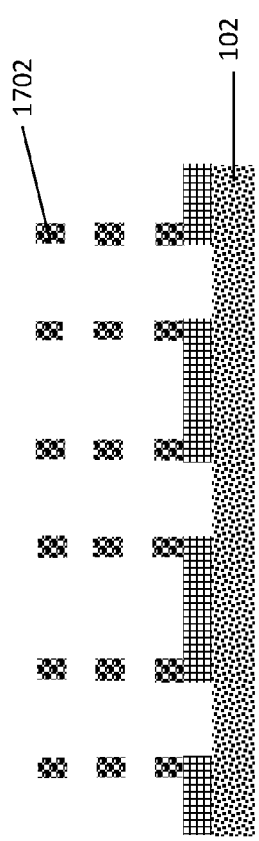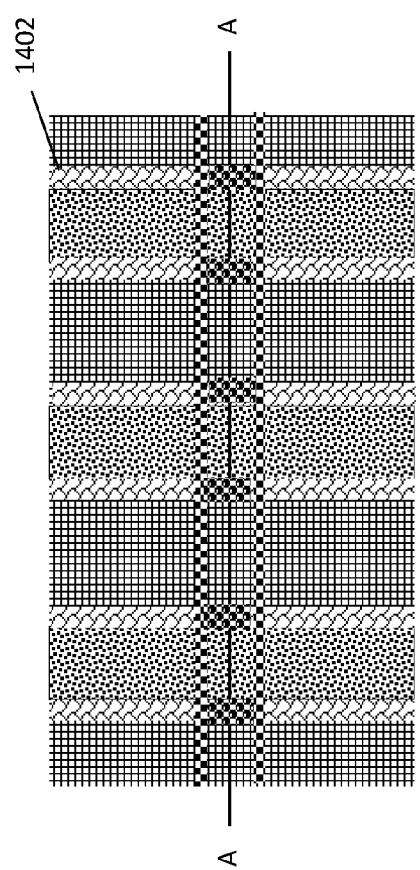

NANOWIRE SEMICONDUCTOR DEVICE

DOMESTIC PRIORITY

This application is a divisional of co-pending U.S. patent application Ser. No. 14/978,362, filed Dec. 22, 2015, which is herein incorporated by reference.

BACKGROUND

The present invention relates to semiconductor devices, and more specifically, to nanowire transistor devices.

Field effect transistors (FETs) are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons are allowed to travel through the channel between a source region and a drain region of the semiconductor body. Complementary metal-oxide-semiconductor field-effect transistor, which are typically referred to as CMOS devices, have become widely used in the semiconductor industry. These CMOS devices include both n-type and p-type (NMOS and PMOS) transistors, and therefore promote the fabrication of logic and various other integrated circuitry.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques.

SUMMARY

Disclosed herein is a method for forming a nanowire device comprises depositing a hard mask on portions of a silicon substrate having a <110> orientation wherein the hard mask is oriented in the <112> direction, etching the silicon substrate to form a mandrel having (111) faceted sidewalls and a hard mask disposed on top of the mandrel; forming a layer of insulator material on the substrate; forming a sacrificial stack comprising alternating layers of sacrificial material and dielectric material disposed on the layer of insulator material and adjacent to the mandrel; patterning and etching the sacrificial stack to form a modified sacrificial stack adjacent to the mandrel and extending 3 nanometers (nm) to 15 nm from the mandrel; removing the sacrificial material from the modified sacrificial stack to form growth channels; epitaxially forming semiconductor in the growth channels; and etching the semiconductor to align with the end of the growth channels and form a semiconductor stack comprising alternating layers of dielectric material and semiconductor material. The method can further comprise removing the mandrel and the hard mask disposed on top of the mandrel; forming a dummy gate across the semiconductor stack; forming a first spacer and a second spacer on opposite sides of the dummy gate across the semiconductor stack; removing the dummy gate; and removing the dielectric material from the semiconductor stack.

Also disclosed herein is a method for forming a nanowire device comprises depositing a hard mask comprising hafnium oxide or tungsten on portions of a silicon substrate having a <110> orientation wherein the hard mask is oriented in the <112> direction, etching the silicon substrate to form a mandrel having (111) faceted sidewalls and a hard mask disposed on top of the mandrel; forming a layer of insulator material on the substrate; forming a sacrificial stack comprising alternating layers of sacrificial material and dielectric material disposed on the layer of insulator material and adjacent to the mandrel; patterning and etching the sacrificial stack to form a modified sacrificial stack adjacent to the mandrel and extending 3 nm to 15 nm from the mandrel; removing the sacrificial material from the modified sacrificial stack to form growth channels; epitaxially forming III-V semiconductor in the growth channels; and etching the III-V semiconductor to align with the end of the growth channels and form a semiconductor stack comprising alternating layers of dielectric material and semiconductor material. The method can further comprise removing the mandrel and the hard mask disposed on top of the mandrel; forming a dummy gate across the semiconductor stack; forming a first spacer and a second spacer on opposite sides of the dummy gate across the semiconductor stack; removing the dummy gate; and removing the dielectric material from the semiconductor stack.

According to yet another embodiment of the present invention, a semiconductor device comprises a first vertical stack above an insulating layer and a second vertical stack above the insulating layer, wherein the first and second vertical stacks comprise a plurality of nanowires with dielectric material disposed between the nanowires and further wherein the width of the nanowires is equivalent to the width of the dielectric material.

BRIEF DESCRIPTION OF THE DRAWINGS

FIG. 10 illustrates a side view of the structure of FIG. 9 after the removal of the mandrel and the hard mask disposed on the mandrel.

FIG. 11 is a top view of the structure of FIG. 10.

FIG. 17 and FIG. 18 show the structure of FIG. 15 and FIG. 16 after the removal of the remaining sacrificial material.

DETAILED DESCRIPTION

The exemplary embodiments of methods and structures described herein include a method for forming a nanowire device having multiple nanowires stacked above each other substantially in a common plane that is substantially perpendicular to a substrate. The exemplary embodiments provide for the formation of semiconductor nanowires that are formed from any suitable epitaxially grown semiconductor material.

Figure 1:
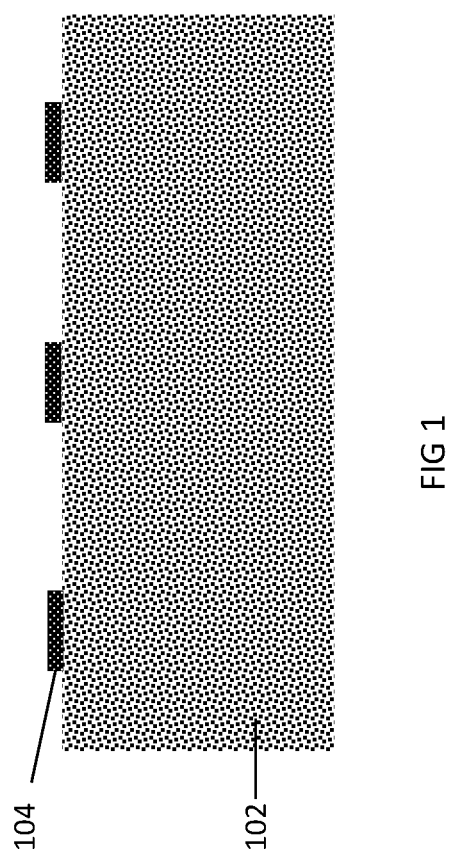
FIG. 1 illustrates a side view of an exemplary semiconductor substrate and a hardmask layer.

FIG. 1 illustrates a side view of an exemplary semiconductor substrate 102 and a hard mask 104 arranged on portions of the semiconductor substrate 102 and aligned in the <112> direction based on the crystal structure of the substrate. The substrate has a <110> orientation. Non-limiting examples of suitable substrate materials include Si (silicon), SiGe (silicon germanium), Ge (germanium), and semiconductor-on-insulator (SOI) substrates with buried oxide (BOX) layers. The Si, SiGe, and Ge are single crystal materials having a <110> orientation. An SOI wafer includes a layer of semiconductor atop an insulating layer (i.e., an oxide layer) which is in turn disposed on a silicon substrate. The layer of semiconductor atop the insulating layer has a <110> orientation.

The hard mask can be applied to the entire surface of the substrate and then selectively removed using lithography and etching. Lithography can include forming a photoresist (not shown) on the hard mask layer, exposing the photoresist to a desired pattern of radiation, and then developing the exposed photoresist with a resist developer to provide a patterned photoresist on top of the hard mask layer. At least one etch is employed to transfer the pattern from the patterned photoresist into hard mask layer. The etching process may be a dry etch (e.g., reactive ion etching, plasma etching, ion beam etching, or laser ablation). After transferring the pattern, the patterned photoresist is removed utilizing resist stripping processes, for example, ashing. Ashing may be used to remove a photoresist material, amorphous carbon, or organic planarization (OPL) layer. Ashing is performed using a suitable reaction gas, for example, $O_2$, $N_2$, $H_2/N_2$, $O_3$, $CF_4$, or any combination thereof. Patterning and etching results in a hard mask aligned to the <112> direction of the substrate. The hard mask may have a width of 10 nm to 100 nm, or a width of 20 nm to 50 nm. The width of the hard mask affects the width of the mandrel and spacing between stacks of nanowires.

In the illustrated embodiment, the hard mask layer 104 can also be used as a polish stop layer. Exemplary materials that can be used as both a hard mask and polish stop include crystalline hafnium oxide ($HfO_2$) and tungsten. The hard mask layer can be deposited by physical vapor deposition or chemical vapor deposition.

Figure 2:
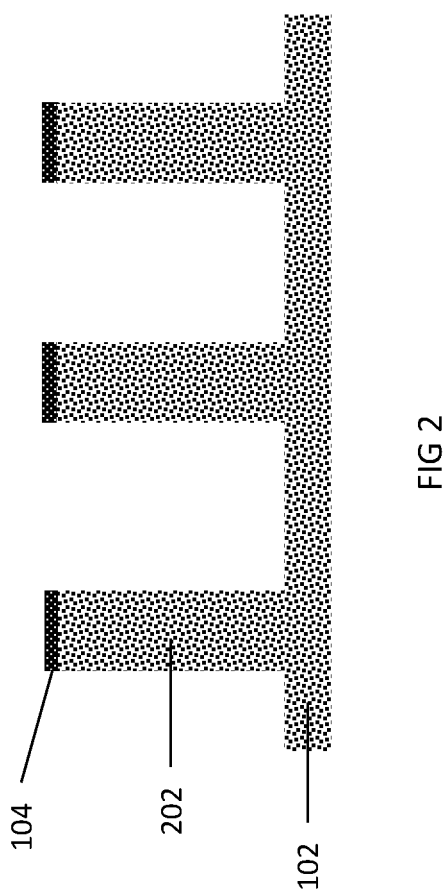
FIG. 2 illustrates a side view of the resultant structure following the formation of mandrels.

FIG. 2 illustrates a side view of the resultant structure following the formation of mandrels 202. The mandrels 202 are formed by removing portions of the substrate 102 material to form the mandrels 202. The mandrels 202 have sidewalls 204 that are substantially vertical. The substrate material is removed by etching. The etching process may be a wet chemical etch (e.g., with potassium hydroxide, or sulfuric acid and hydrogen peroxide). Both dry etching and wet chemical etching processes may be used. The mandrels have (111) faceted side walls. The (111) faceted sidewalls are desirable because <111> is the preferred growth orientation for many III-V materials.

Figure 3:
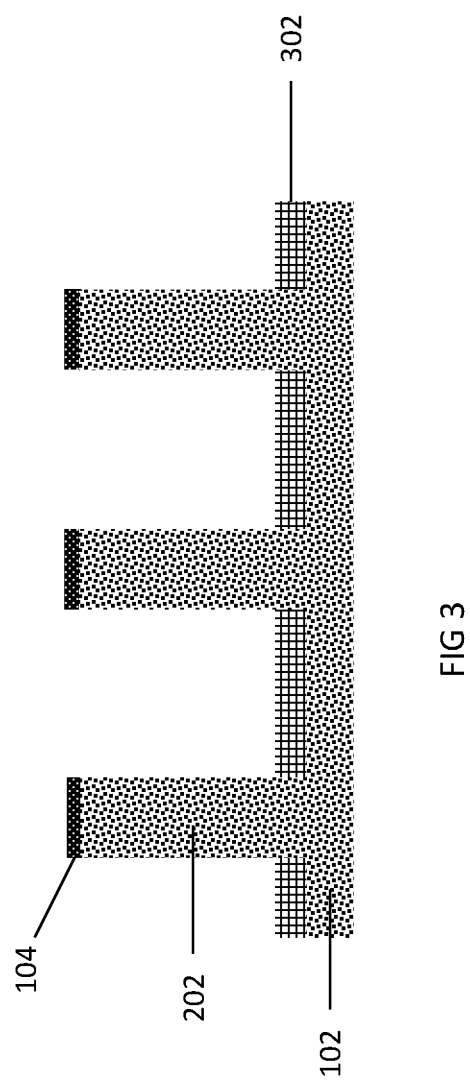
FIG. 3 illustrates a side view following the formation of an insulator layer.

An insulating material is deposited on the structure of FIG. 2. Exemplary deposition methods include chemical vapor deposition and physical vapor deposition. After deposition the insulating material is planarized and polished using chemical mechanical planarization (CMP) and insulating material is removed by wet etching to achieve the desired thickness for the insulating layer 302 and expose the mandrels 202 as shown in FIG. 3. Exemplary materials for the insulating layer 302 include oxides, nitrides, oxynitrides, silicates (e.g., metal silicates), aluminates, titanates, nitrides, or any combination thereof. More specific examples include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, silicon nitride, boron nitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. In some embodiments the insulating layer comprises silicon nitride or boron nitride FIG. 3 is a side view showing insulating layer 302 on previously exposed portions of substrate 102 adjacent to mandrels 202.

Figure 4:
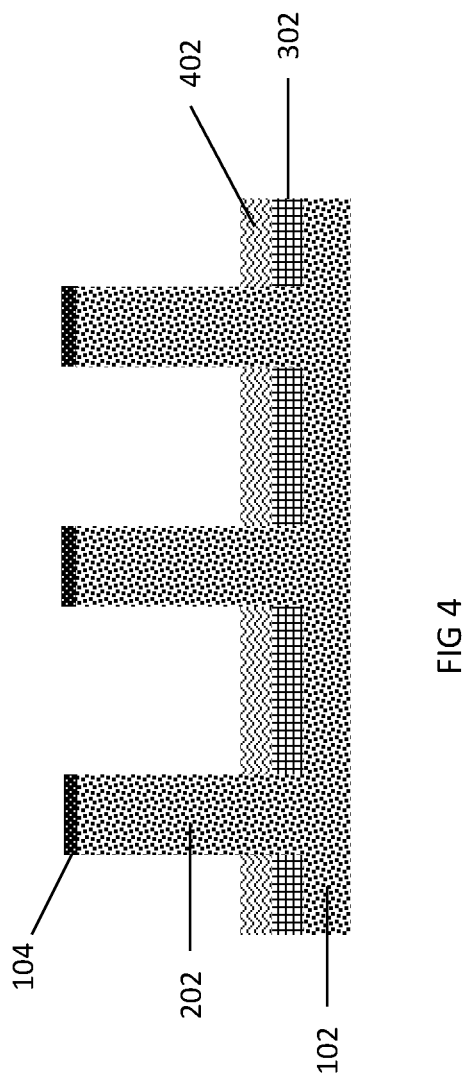
FIG. 4 illustrates a side view following the formation of a sacrificial layer on the insulator layer.

A sacrificial material is deposited on the structure of FIG. 3. The sacrificial material is chosen in order to be selectively removed without alteration to the mandrel or the insulating layer. Exemplary materials include silicon nitride or silicon dioxide. These materials can be deposited by chemical vapor deposition or physical vapor deposition. After deposition the sacrificial material is planarized and polished using chemical mechanical planarization (CMP) and sacrificial material is removed by wet etching to achieve the desired thickness. The thickness of the sacrificial material will determine the height of the nanowire. The sacrificial layer can have a thickness of 3 nm to 20 nm, or, 5 nm to 10 nm. FIG. 4 is a side view showing the sacrificial layer 402 on the insulating layer 302 and adjacent to mandrels 202.

Figure 5:
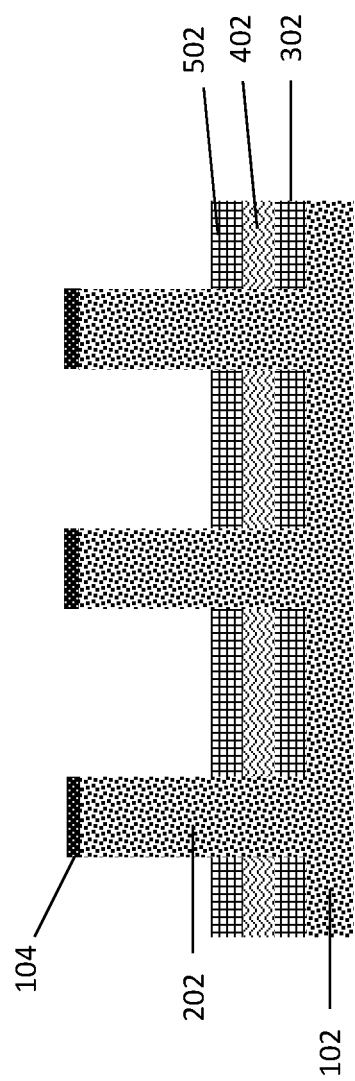
FIG. 5 illustrates a side view following the formation of a sacrificial layer on the sacrificial layer.

A dielectric material is deposited on the structure of FIG. 4. The dielectric material is chosen in order to remain unaltered upon removal of the sacrificial material. The dielectric material may comprise the same or different material as the insulating layer. In some embodiments the dielectric material comprises silicon nitride. After deposition the dielectric material is planarized and polished using chemical mechanical planarization (CMP) followed by wet etching to achieve the desired thickness. The thickness of the dielectric material will determine the spacing between the nanowires. The dielectric layer can have a thickness of 5 nm to 30 nm, or, 10 nm to 20 nm. FIG. 5 is a side view showing the dielectric layer 502 on sacrificial layer 402 and adjacent to mandrels 202.

Alternating layers of sacrificial material and dielectric material are deposited until the desired number of layers is attained in the sacrificial stack. The thickness of the sacrificial layers and the dielectric layers can be varied depending on the design needs of the final device. The final layer is a sacrificial layer. The illustrated embodiments are mere examples. Alternate embodiments may include any number of nanowires arranged in a coplanar stack i.e., three or more coplanar nanowires. Additional nanowires may be formed by using similar methods as described above. The illustrated exemplary embodiments only include three mandrels 202, however alternate embodiments may include any number of mandrels 202 arranged on the substrate 102, which could be used to form any desired number of nanowires.

Figure 6:
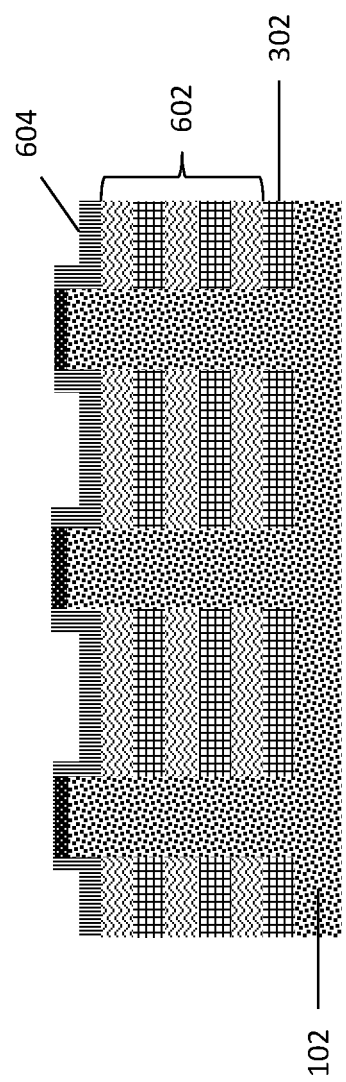
FIG. 6 illustrates a side view following the formation of a sacrificial stack with a spacer dielectric disposed on top of the sacrificial stack.

A spacer dielectric is deposited on top of the upper most layer of the sacrificial stack. The spacer dielectric is removed from the top of the hard mask. The resulting structure is shown in FIG. 6. FIG. 6 is a side view showing sacrificial stack 602 on insulating layer 302. Spacer dielectric 604 is disposed on sacrificial stack 602.

Figure 7:
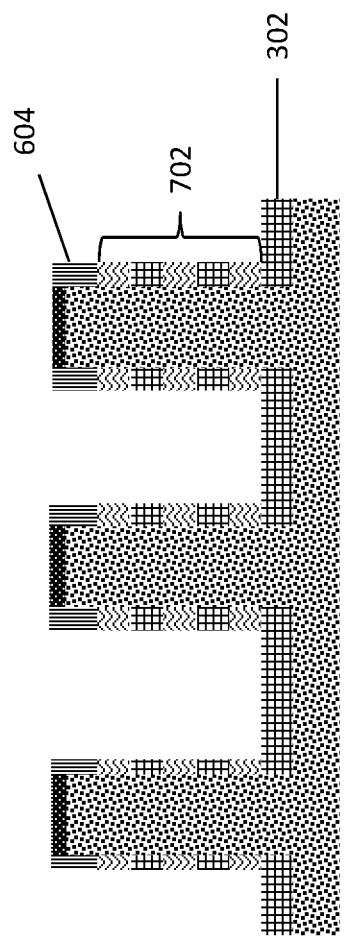
FIG. 7 illustrates a side view following the formation of a modified sacrificial stack adjacent to a mandrel.

Portions of the sacrificial stack are selectively removed using lithography and etching to form a modified sacrificial stack. Lithography can include forming a photoresist (not shown) on the hard mask layer, exposing the photoresist to a desired pattern of radiation, and then developing the exposed photoresist with a resist developer to provide a patterned photoresist on top of the hard mask layer. The etching process may be a dry etch (e.g., reactive ion etching, plasma etching, ion beam etching, or laser ablation). FIG. 7 is a side view showing modified sacrificial stack 702 adjacent to mandrel 202 and capped by spacer dielectric 604. Modified sacrificial stack 702 extends from mandrel 202 by 3 nm to 15 nm, or 5 nm to 10 nm.

Figure 8:
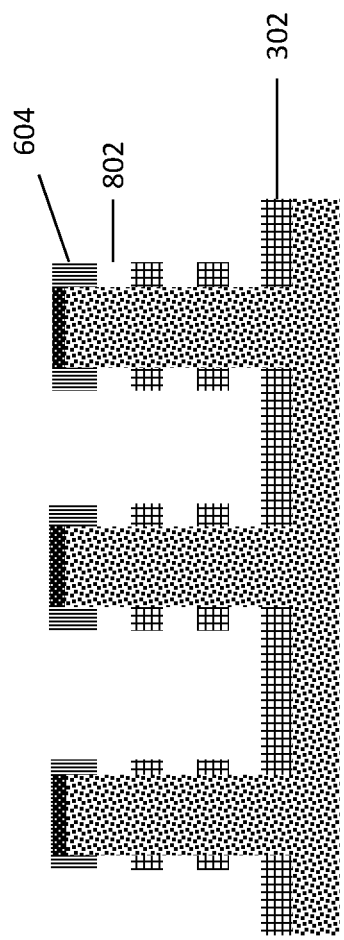
FIG. 8 illustrates a side view following the removal of sacrificial material from the modified sacrificial stack to form growth channels.

The remaining sacrificial material is removed by wet etching to form growth channels 802 as shown in FIG. 8. Semiconductor is epitaxially grown in growth channels 802. The terms "epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a (111) crystal surface will take on a (111) orientation. The mandrels 202 have a (111) crystal face and function as the seed surface for the epitaxial growth of the semiconductor in growth channels 802.

The semiconductor may be grown from gaseous or liquid precursors. Exemplary methods include vapor-phase epitaxy (VPE), molecular-beam epitaxy (MBE), and liquid-phase epitaxy (LPE). The semiconductor may be doped with an n-type dopant or a p-type dopant. Following the epitaxial growth process, an annealing process may be performed to diffuse dopants into the semiconductor material.

Figure 9:
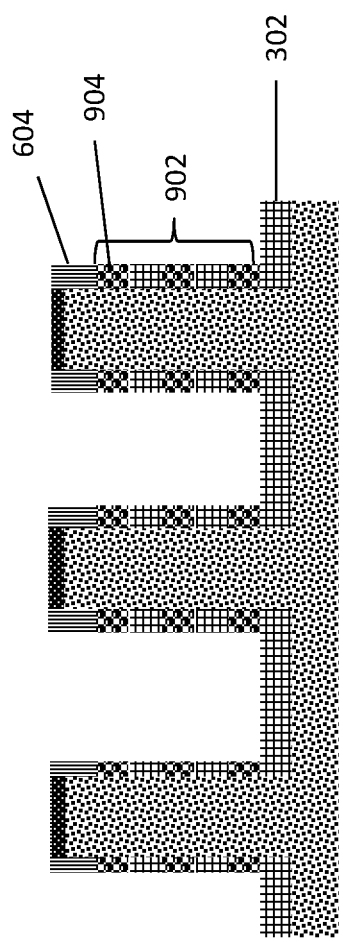
FIG. 9 illustrates a side view following the epitaxial growth of semiconductor in the growth channels.

The semiconductor is etched to align with the end of the growth channels and form a semiconductor stack 902 comprising alternating layers of dielectric material and semiconductor material 904 as shown in FIG. 9. The dielectric material and the semiconductor material 904 have the same width.

In some embodiments the semiconductor is a III-V semiconductor. As used herein, the term "III-V semiconductor" denotes a semiconductor material that includes at least one element from Group III of the Periodic Table of Elements (B, Al, Ga, In) and at least one element from Group V of the Periodic Table of Elements (N, P, As, Sb, Bi). Typically, the III-V semiconductors may be binary alloys, ternary alloys, or quaternary alloys, of III-V elements. Examples of III-V semiconductors include, but are not limited to indium gallium arsenide (InGaAs), aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AnnAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

In some embodiments the semiconductor is a II-VI semiconductor. As used herein, the term "II-VI semiconductor" denotes a semiconductor material that includes at least one element from Group II of the Periodic Table of Elements (Zn, Cd, Hg) and at least one element from Group VI of the Periodic Table of Elements (O, S, Se, Te, Po). Typically, the III-V semiconductors may be binary alloys, ternary alloys, or quaternary alloys, of III-V elements. Examples of II-VI semiconductors include, but are not limited to ZnSe, ZnS, ZnTe, CdZnTe, HgCdTe, HgZnTe, HgZnSe, and alloys thereof.

Selective etching is used to remove the hard mask 104 and the mandrels 202. FIGS. 10 and 11 show the resulting structure. FIG. 10 is a side view showing semiconductor stack 902 on insulating layer 302 and topped by spacer dielectric 604. FIG. 11 is a top view showing spacer dielectric 604 (on top of semiconductor stacks 902 which are not shown), insulating layer 302 and substrate 102.

Figure 12:
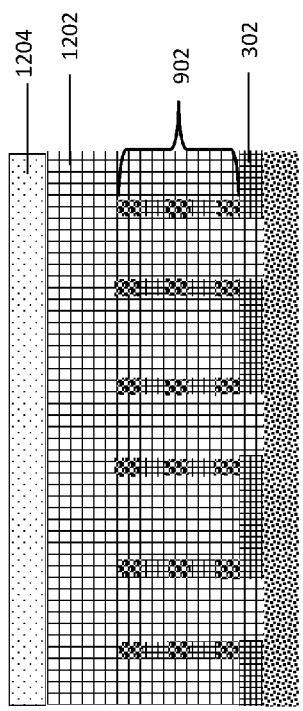
FIG. 12 is a cut away view along line A-A of FIG. 13.
Figure 13:
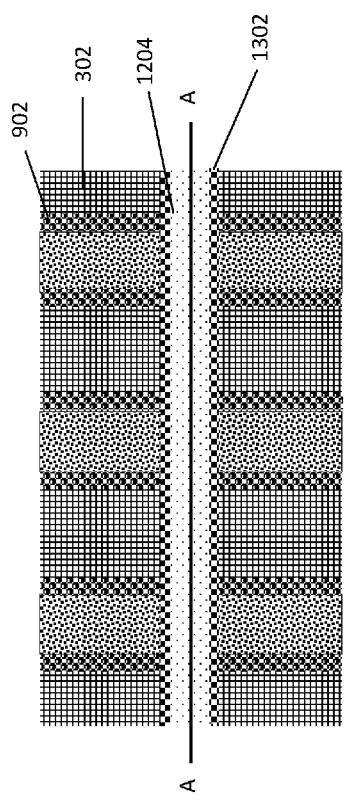
FIG. 13 is a top view showing the structure of FIG. 11 after the formation of a dummy gate.

The spacer dielectric 604 is removed from the top of the semiconductor stacks 902. A dummy gate is then formed over the semiconductor stacks 902. The dummy gate comprises an insulator material 1202 and a hard mask 1204 as shown in FIG. 12 and side walls 1302 as shown in FIG. 13. FIG. 12 is a cut away view along the line A-A of the top view shown in FIG. 13. The insulator material 1202 may include, for example, an oxide material similar to the materials that form the insulator layer 302 and dielectric material 502. Following the deposition of the insulator material 1202, a planarization process such as, for example, chemical mechanical polishing may be used to form a substantially planar surface. A hard mask 1204 is disposed on exposed portions of insulator material 1202. The hard mask 1204 can be, for example, a nitride material ($SiN_x$). FIG. 12 illustrates the semiconductor stack 902, and the insulator material 1202 and hard mask 1204.

Figure 14:
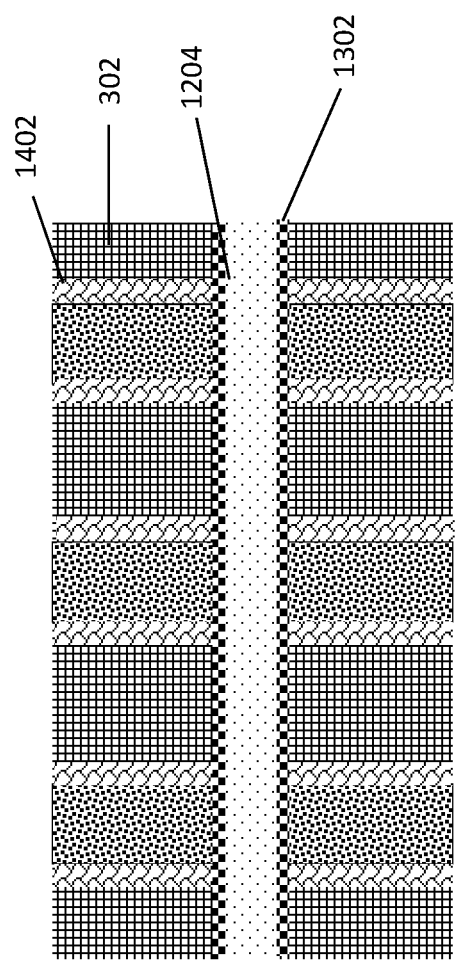
FIG. 14 is a top view showing the structure of FIG. 13 after the formation of source and drain regions.

FIG. 14 illustrates a top view following an epitaxial growth process that forms source and drain (active regions) 1402. As used herein, the term "drain" means a doped region in a semiconductor device located at the end of the channel region, in which carriers are flowing out of the device through the drain. The term "source" is a doped region in the semiconductor device, in which majority carriers are flowing into the channel region. The channel region is the region underlying the gate structure and between the source and drain regions of the semiconductor device that becomes conductive when the semiconductor device is turned on.

An epitaxial growth process is performed to deposit a crystalline layer onto a crystalline substrate beneath. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The source and drain semiconductor can be doped during deposition by adding a dopant or impurity to form a silicide. For example, silicon may be doped with an n-type dopant (e.g., phosphorus or arsenic) or a p-type dopant (e.g., boron or gallium), depending on the type of transistor. N-type and p-type active regions may be formed on the same wafer by alternating masking and epitaxial growth processes to form n-type and p-type active regions if desired. Following the epitaxial growth process, an annealing process may be performed to diffuse dopants into the semiconductor material.

In some embodiments the source and drain may comprise a III-V semiconductor. The source and drain may be formed by doping the III-V semiconductor using ion implantation. The effect of the dopant atom in the III-V semiconductor, i.e., whether it is a p-type or n-type dopant, depends on the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such as silicon (Si), have the property that they can act as acceptors or donors depending on whether they occupy the site of group III or group V atoms respectively. Such impurities are known as amphoteric impurities.

Figure 15:
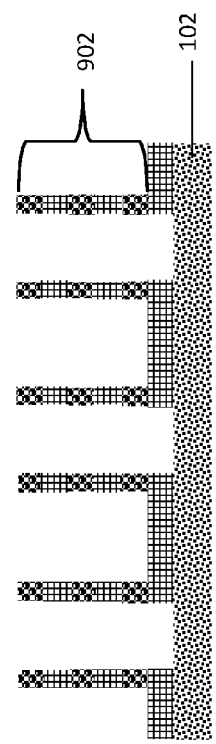
FIG. 15 is a cut away view along line A-A of FIG. 16.
Figure 16:
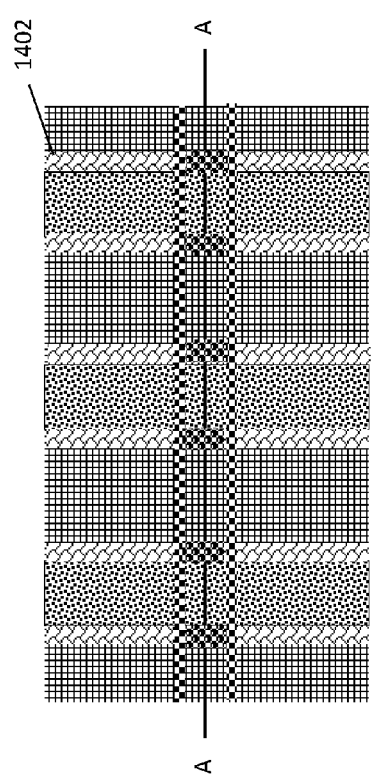
FIG. 16 is a top view showing the structure of FIG. 14 after the removal of the dummy gate.

FIG. 16 illustrates a top view of the resultant structure following an etching process such as, for example reactive ion etching that is selective to removing exposed portions of the hardmask 1204 and the insulator material 1202 (of FIG. 12). The etching process exposes portions of the substrate 102 and the semiconductor stack 902. FIG. 15 is a cut away view along the line A-A of the top view shown in FIG. 16.

FIGS. 17 and 18 show the resulting structure after the remaining sacrificial material is removed from semiconductor stacks 902 (from FIGS. 15 and 16) resulting in nanowires 1702. FIG. 17 is a cut away view along the line A-A of the top view shown in FIG. 18. FIG. 17 demonstrates how nanowires 1702 are suspended above the substrate 102.

Gate stacks can be formed over the channel region of the nanowires 1702 between the side walls 1302. A high-k dielectric material 2104 is disposed around the channel regions of the nanowires between the sidewalls. The high-k dielectric material(s) can be a dielectric material having a dielectric constant greater than 4.0, 7.0, or 10.0. Non-limiting examples of suitable materials for the high-k dielectric material 2104 include oxides, nitrides, oxynitrides, silicates (e.g., metal silicates), aluminates, titanates, nitrides, or any combination thereof. Other examples of high-k materials 2104 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Following the deposition of the high-k material over the channel regions of the nanowires 1702, a work function metal(s) may be disposed over the high-k dielectric material. The type of work function metal(s) depends on the type of transistor and may differ between a NFET and a PFET. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

Following the formation of the gate stacks, nanowire field effect transistor (FET) devices are substantially completed. Subsequently, insulator layers may be deposited over the devices, and conductive contacts that contact the active regions may be formed using suitable deposition, patterning, and polishing processes.

The methods described herein provide for stacked nanowires formed from epitaxially grown semiconductor material, particularly III-V semiconductors. Use of the mandrel having a (111) faceted face provides a preferred direction of growth for the III-V semiconductor in the growth channels. The spacer and dielectric allow for excellent control of the nanowire size.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a nanowire device, the method comprising:

depositing a hard mask on portions of a silicon substrate having a <110> orientation wherein the hard mask is oriented in the <112> direction;

etching the silicon substrate to form a mandrel having (111) faceted sidewalls and a hard mask disposed on top of the mandrel;

forming a layer of insulator material on the substrate and adjacent to the mandrel;

forming a sacrificial stack comprising alternating layers of sacrificial material and dielectric material disposed on the layer of insulator material and adjacent to the mandrel;

patterning and etching the sacrificial stack to form a modified sacrificial stack adjacent to the mandrel and extending 3 nanometers to 15 nanometers from the mandrel;

removing the sacrificial material from the modified sacrificial stack to form growth channels;

epitaxially forming semiconductor in the growth channels; and etching the semiconductor to align with the end of the growth channels and form a semiconductor stack comprising alternating layers of dielectric material and semiconductor material.

2. The method of claim 1, further comprising:
removing the mandrel and the hard mask disposed on top of the mandrel;
forming a dummy gate across the semiconductor stack;
forming a first spacer and a second spacer on opposite sides of the dummy gate across the semiconductor stack;
removing the dummy gate; and
removing the dielectric material from the semiconductor stack after removing the dummy gate.

3. The method of claim 1, wherein the layers of sacrificial material have a thickness of 3 nanometers to 20 nanometers.

4. The method of claim 1, wherein the layers of dielectric material have a thickness of 5 nanometers to 30 nanometers.

5. The method of claim 1, wherein the hard mask has a width of 10 nanometers to 100 nanometers.

6. The method of claim 1, wherein the hard mask comprises hafnium oxide or tungsten.

7. The method of claim 1, wherein the sacrificial material comprises silicon nitride or silicon dioxide.

8. The method of claim 1, wherein the dielectric material comprises silicon nitride and the sacrificial material comprises silicon dioxide.

9. The method of claim 1, wherein the dielectric layer has a thickness of 10 nanometers to 20 nanometers.

10. The method of claim 1, wherein the semiconductor is a III-V semiconductor.

11. A method for forming a nanowire device, wherein the method comprises:
depositing a hard mask comprising hafnium oxide or tungsten on portions of a silicon substrate having a <110> orientation wherein the hard mask is oriented in the <112> direction;
etching the silicon substrate to form a mandrel having (111) faceted sidewalls and a hard mask disposed on top of the mandrel;
forming a layer of insulator material on the substrate;
forming a sacrificial stack comprising alternating layers of sacrificial material and dielectric material disposed on the layer of insulator material and adjacent to the mandrel;
patterning and etching the sacrificial stack to form a modified sacrificial stack adjacent to the mandrel and extending 3 nanometers to 15 nanometers from the mandrel;
removing the sacrificial material from the modified sacrificial stack to form growth channels;
epitaxially forming III-V semiconductor in the growth channels; and
etching the III-V semiconductor to align with the end of the growth channels and form a semiconductor stack comprising alternating layers of dielectric material and semiconductor material.

12. The method of claim 11, further comprising:
removing the mandrel and the hard mask disposed on top of the mandrel;
forming a dummy gate across the semiconductor stack;
forming a first spacer and a second spacer on opposite sides of the dummy gate across the semiconductor stack;
removing the dummy gate; and
removing the dielectric material from the semiconductor stack.

13. The method of claim 11, wherein the layers of sacrificial material have a thickness of 3 nanometers to 20 nanometers and the layers of dielectric material have a thickness of 5 nanometers to 30 nanometers.

14. The method of claim 11, wherein the hard mask has a width of 10 nanometers to 100 nanometers.

15. The method of claim 11, wherein the sacrificial material comprises silicon dioxide and the dielectric material comprises silicon nitride.

16. The method of claim 11, wherein the III-V semiconductor comprises a III-V semiconductor.

* * * * *